United States Patent
Taito et al.

(10) Patent No.: US 6,781,431 B2
(45) Date of Patent: Aug. 24, 2004

(54) CLOCK GENERATING CIRCUIT

(75) Inventors: Yasuhiko Taito, Hyogo (JP); Akira Yamazaki, Hyogo (JP); Fukashi Morishita, Hyogo (JP); Nobuyuki Fujii, Hyogo (JP); Mihoko Akiyama, Hyogo (JP); Mako Okamoto, Hyogo (JP)

(73) Assignees: Rensas Technology Corp., Tokyo (JP); Mitsubishi Electric Engineering Company Limited, Tokyo (JP)

(*) Notice: Subject to any disclaimer, the term of this patent is extended or adjusted under 35 U.S.C. 154(b) by 0 days.

(21) Appl. No.: 10/349,033

(22) Filed: Jan. 23, 2003

(65) Prior Publication Data

US 2003/0117204 A1 Jun. 26, 2003

Related U.S. Application Data

(62) Division of application No. 09/793,759, filed on Feb. 27, 2001, now abandoned.

(30) Foreign Application Priority Data

Sep. 19, 2000 (JP) ........................................ 2000-283064

(51) Int. Cl.$^7$ ................................................ G06F 1/04

(52) U.S. Cl. ........................... 327/291; 327/295; 331/57

(58) Field of Search ................................. 327/291, 101, 327/105, 113, 114, 164–166, 256–258, 293–295; 326/93–95; 331/57

(56) References Cited

U.S. PATENT DOCUMENTS

| | | | | |
|---|---|---|---|---|
| 4,105,980 A | | 8/1978 | Cowardin et al. | .......... 327/165 |
| 4,164,666 A | * | 8/1979 | Hirasawa | ...................... 326/97 |
| 4,845,390 A | * | 7/1989 | Chan | .......................... 327/278 |
| 4,853,654 A | * | 8/1989 | Sakurai | ........................ 331/57 |
| 4,884,041 A | * | 11/1989 | Walker | .......................... 331/57 |
| 5,097,226 A | | 3/1992 | Pascucci et al. | ............... 331/46 |
| 5,121,070 A | * | 6/1992 | Tomita | ........................ 329/304 |
| 5,208,557 A | | 5/1993 | Kersh, III | ..................... 331/57 |
| 5,315,181 A | | 5/1994 | Schowe | ......................... 326/93 |
| 5,379,325 A | | 1/1995 | Katayama et al. | .......... 375/106 |
| 5,392,205 A | | 2/1995 | Zavaleta | ....................... 363/59 |
| 5,451,911 A | * | 9/1995 | Colvin et al. | .................. 331/57 |
| 5,502,418 A | * | 3/1996 | Arai | ............................. 331/57 |
| 5,519,360 A | * | 5/1996 | Keeth | ........................... 331/57 |
| 5,537,062 A | | 7/1996 | Mote, Jr. | ....................... 326/93 |
| 5,539,337 A | | 7/1996 | Taylor et al. | .................. 326/94 |
| 5,550,489 A | * | 8/1996 | Raab | ............................. 326/93 |
| 5,686,867 A | * | 11/1997 | Sutardja et al. | ............... 331/57 |
| 5,731,715 A | | 3/1998 | Mote, Jr. | ....................... 326/93 |
| 5,808,486 A | | 9/1998 | Smiley | ......................... 327/34 |
| 5,838,613 A | * | 11/1998 | Takizawa | ............... 365/185.04 |
| 5,847,590 A | * | 12/1998 | Yamazaki | .................... 327/265 |
| 5,889,709 A | * | 3/1999 | Fukuda | .................. 365/189.05 |

(List continued on next page.)

FOREIGN PATENT DOCUMENTS

JP          10-302477          11/1998

*Primary Examiner*—Timothy P. Callahan
*Assistant Examiner*—Hai L. Nguyen
(74) *Attorney, Agent, or Firm*—McDermott Will & Emery LLP (57) ABSTRACT

The clock-generating circuit for generating a clock signal, includes a ring oscillator having an odd number of inverters connected in a ring configuration. The ring oscillator is activated to generate a clock signal when an activating signal is at a first level and is de-activated to cease generation of the clock signal when the activating signal is at a second level. A latch circuit is connected to an output node of the ring oscillator, and holds a level of the output node of the ring oscillator in response to transition of the activating signal from the first level to the second level. When the activating signal is lowered from the H level to the L level, the level of the clock signal is latched such that generation of a glitch in the clock signal will be prevented from occurring.

8 Claims, 7 Drawing Sheets

U.S. PATENT DOCUMENTS

| | | | | |
|---|---|---|---|---|
| 5,959,854 A | * | 9/1999 | Okada | 363/60 |
| 6,041,011 A | | 3/2000 | Umezawa et al. | 365/226 |
| 6,072,345 A | * | 6/2000 | Ooishi | 327/157 |
| 6,154,411 A | * | 11/2000 | Morishita | 365/226 |
| 6,184,741 B1 | | 2/2001 | Ghilardelli et al. | 327/536 |
| 6,310,500 B1 | * | 10/2001 | Varma | 327/211 |
| 6,492,862 B2 | * | 12/2002 | Nakahara | 327/536 |
| 6,525,972 B2 | * | 2/2003 | Yanagisawa | 365/189.09 |

* cited by examiner

FIG.3A CLK0

FIG.3E CLK

TIME t →

CLOCK GENERATING CIRCUIT

This application is a divisional of application Ser. No. 09/793,759 filed Feb. 27, 2001 abn.

BACKGROUND OF THE INVENTION

1. Field of the Invention

The present invention relates to a clock generating circuit and particularly, to a clock generating circuit that generates a clock signal when an activating signal is at a first level, while ceasing generation of a clock signal when the activating signal is at a second level.

2. Description of the Background Art

A dynamic random access memory (hereinafter referred to as DRAM) has been mainly fabricated in a CMOS process, wherein memory cells thereof are each constructed from an N channel MOS transistor and a capacitor. When data is written onto a memory cell, a boosted potential Vpp higher than a normal H level (external power source potential ExVdd) is applied to the gate of the N channel MOS transistor in order to prevent a potential drop in the N channel MOS transistor. For this reason, a boosted potential generating circuit for generating the boosted potential Vpp from the external power source potential ExVdd is incorporated in DRAM.

Figure 11:
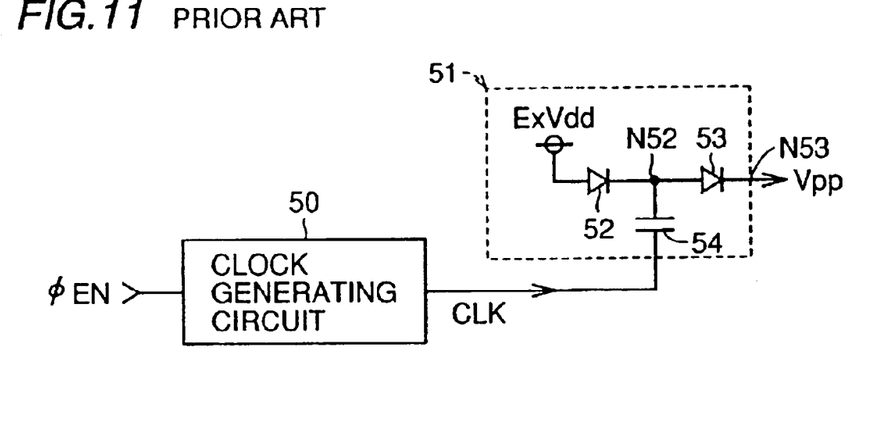
FIG. 11 is a circuit block diagram representing a main part of a prior art boosted potential generating circuit.

FIG. 11 is a circuit block diagram representing a main part of such a boosted potential generating circuit.

Figure 12:
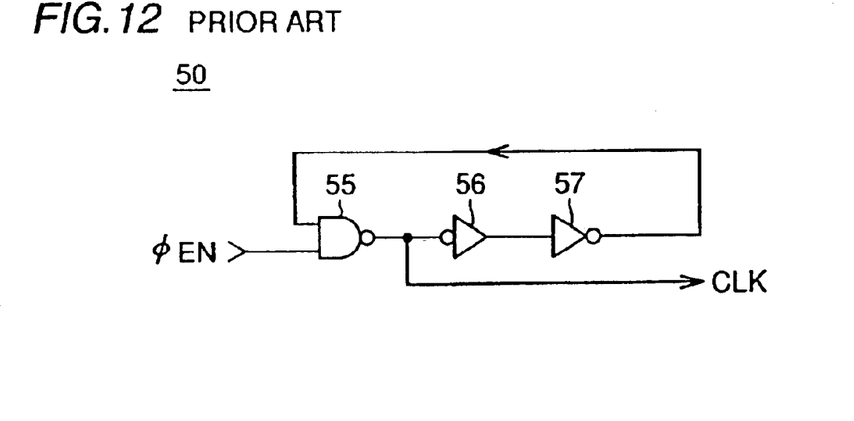
FIG. 12 is a circuit block diagram representing a configuration of a clock generating circuit shown in FIG. 11.

In FIG. 11, the boosted potential generating circuit includes: a clock generating circuit 50; and a charge pump circuit 51. The clock generating circuit 50, as shown in FIG. 12, includes: a NAND gate 55 and inverters 56 and 57. The inverters 56 and 57 are connected in series between the output node of the NAND gate 55 and one input node thereof. The other input node thereof receives an activating signal φEN. The activating signal φEN goes to H level when the boosted potential Vpp is lower than a target potential Vt, while the activating signal φEN goes to L level when the boosted potential Vpp is higher than the target potential Vt. An output signal of the NAND gate 55 serves as a clock signal CLK.

When the activating signal φEN is at H level, the NAND gate 55 acts as an inverter for an output signal of the inverter 57, and the NAND gate 55 and the inverters 56 and 57 constitutes a ring oscillator. Hence, a level of the clock signal CLK is inverted each time when a delay time of the NAND gate and the inverters 56 and 57 elapses. When the activating signal φEN goes to L level, an output level of the NAND gate 55 is fixed at H level.

Returning to FIG. 11, the charge pump circuit 51 includes: diodes 52 and 53; and a capacitor 54. The diodes 52 and 53 are connected in series between an external power source potential ExVdd line and an output node N53. One terminal of the capacitor 54 receives the clock signal CLK, while the other terminal thereof is connected to the cathode (node N52) of the diode 52.

Figure 13:
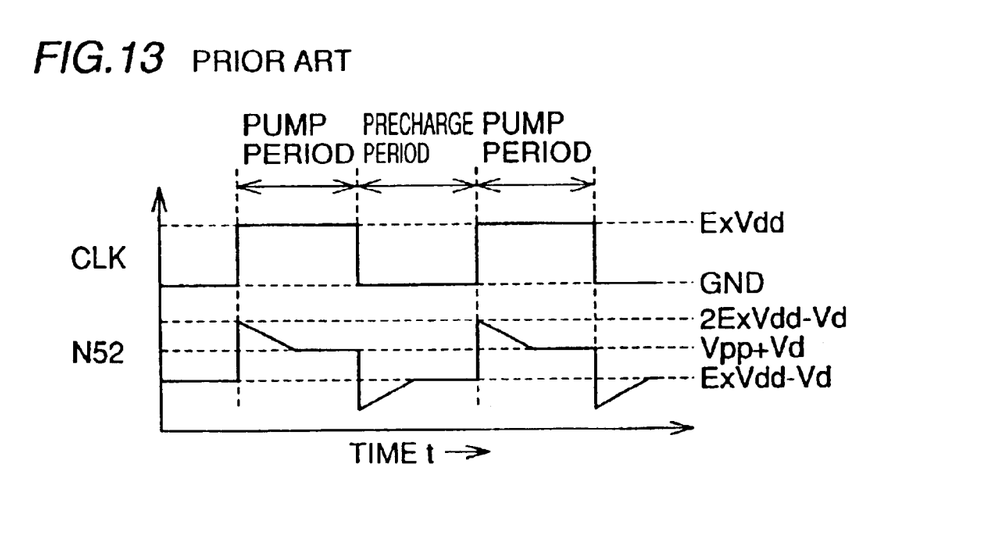
FIG. 13 is a time chart representing operation of the boosted potential generating circuit shown in FIG. 11.

FIG. 13 is a time chart representing operation of the boosted potential generating circuit shown in FIG. 11. It is assumed that in an initial state, the boosted potential Vpp is sufficiently lower than the target potential Vt, the activating signal φEN is forced to go to H level to activate the clock generating circuit 50, thus inverting a level of the clock signal CLK after each elapse of a prescribed time.

During a period in which the clock signal CLK is at L level (ground potential GND), a current flows into the capacitor 54 from the external power source potential ExVdd line through the diode 52, and the capacitor 54 is precharged to ExVdd−Vd, wherein Vd indicates threshold voltages of the respective diodes 52 and 53.

When the clock signal CLK is raised to H level (ExVdd) following the precharge, a level of the node N52 is boosted to 2ExVdd−Vd through the capacitor 54 and a positive electric charge is supplied to the output node N53 from the node N52. A level of the node N52 comes to be Vpp+Vd.

That is, when the activating signal φEN is at H level, the capacitor 54 is charged during a period in which the clock signal CLK (precharge period) is at L level, while a charge of the capacitor 50 is supplied to the output node N53 during a period in which the clock CLK is at H level (pump period) to boost a potential of the output node N53.

When the boosted potential Vpp reaches the target potential Vt and the activating signal φEN goes to L level, a level of the clock signal CLK is fixed at H level and the charge pump circuit 51 is deactivated. When the boosted potential Vpp falls to be lower than the target potential Vt, the activating signal φEN goes to H level to again activate the charge pump circuit 51. Hence, the boosted potential Vpp is held at the target potential Vt.

Figure 14:
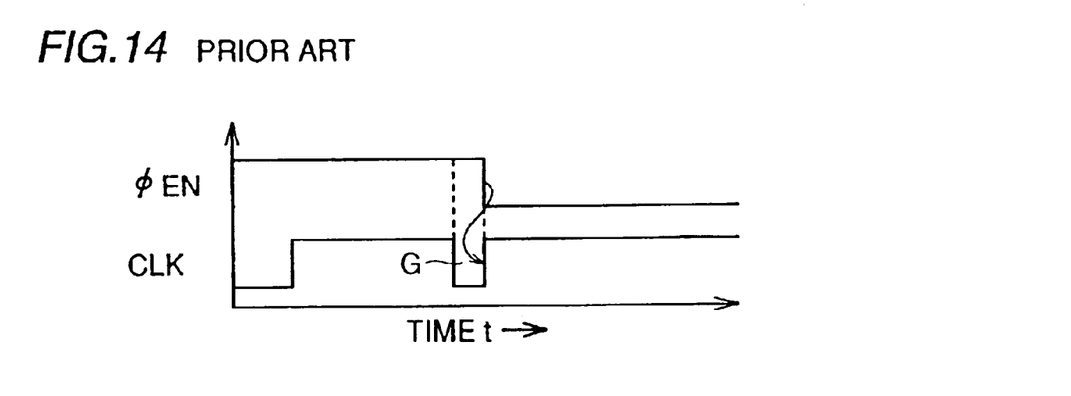
FIG. 14 is a time chart for describing a problematic point of the boosted potential generating circuit shown in FIG. 11.

There was a problem, however, since in a prior art boosted potential generating circuit, when, as shown in FIG. 14, the boosted potential Vpp reaches the target potential Vt in a period in which the clock signal CLK is at L level and the activating signal φEN is lowered from H level to L level, then the clock signal CLK is raised to H level in response to the falling edge of the activating signal φEN and thereby, there arises a so-called glitch G in the clock signal CLK. When such a glitch arises, the charge pump circuit 51 again supplies a positive electric charge in response to the rise of the clock signal CLK and the boosted potential Vpp rises excessively higher than the target potential Vt, even though the boosted potential Vpp has reached the target potential Vt.

SUMMARY OF THE INVENTION

It is accordingly a main object of the present invention is to provide a clock generating circuit capable of preventing generation of a glitch.

In a clock generating circuit relating to the present invention, included are: an oscillator generating a reference clock signal; a first latch circuit, provided between a first and second nodes, and operating in synchronism with the reference clock signal; a second latch circuit, provided between the second node and an output node, and operating in synchronism with a complementary signal of the reference clock signal; and a logic circuit, provided between the output node and the first node, and providing a complementary level of a level on the output node to the first node to generate a clock signal when an activating signal is at a first level, while transmitting a level on the output node to the first node to cease generation of the clock signal when the activating signal is at a second level. Hence, since the clock signal is generated by frequency dividing the reference clock signal with the two latch circuits and the logic circuit, generation of a glitch in the clock signal can be prevented from occurring.

It is preferable that a noise filter for eliminating noise from an output signal of the logic circuit to provide the output signal to the first node is further provided between the output node of the logic circuit and the first node. In this case, even when noise occurs in an output signal of the logic circuit, generation of a glitch in the clock signal can be prevented from occurring.

It is further preferable that the oscillator is activated in response to transition of the activation signal to the first level, while being deactivated in response to transition thereof to the second level. In this case, since when the reference clock signal is unnecessary, the oscillator is deactivated, power consumption can be reduced.

It is still further preferable that further provided is a delay circuit delaying the activating signal by a prescribed time to provide the activating signal to the oscillator. In this case, even when a glitch occurs in the reference clock signal, generation of a glitch in the clock signal can be prevented from occurring since a frequency dividing circuit constructed from the two latch circuits and the logic circuit has ceased a frequency dividing operation in advance.

In another clock generating circuit relating to the present invention, included are: a ring oscillator including an odd number of first inverters connected in a ring configuration, being activated to generate a clock signal when an activating signal is at a first level, while being deactivated to cease generation of the clock signal when the activating signal is at a second level; and a latch circuit, connected to an output node of the ring oscillator, and holding a level of an output node of the ring oscillator in response to transition of the activating signal from the first level to the second level. Hence, since a level of the clock signal is held without any alteration therein in response to transition of the activating signal from the first level to the second level, there is no chance for a glitch to occur in the clock signal.

It is preferable that one first inverter of the odd number of first inverters is a clocked inverter that is activated when the activating signal is at the first level, while being deactivated when the activating signal is at the second level, and whose output node serves as the output node of the ring oscillator. In this case, the clock inverter is deactivated to hold a level of the clock signal at an output level of the clocked inverter, in response to transition of the activating signal from the first level to the second level.

It is further preferable that the ring oscillator further includes: a transfer gate inserted between an output node of one first inverter of the odd number of first inverters and an input node of the subsequent first inverter thereof, and being conductive when the activating signal is at the first level, while being nonconductive when the activating signal is at the second level, wherein the input node of the subsequent inverter serves as an output node of the ring oscillator. In this case, the transfer gate becomes nonconductive and a level of the clock signal is held at an input level of the subsequent inverter of the transfer gate in response to transition of the activating signal from the first level to the second level.

It is further preferable that a first inverter includes first and second transistors of respective different conductivity types connected in series between first and second power source potential lines; and at least one constant current source connected in series to the first and second transistors between the first and second power source potential lines. In this case, even when a power source potential is altered, not only a current driving ability of a first inverter but also a frequency of the clock signal are both prevented from varying.

It is further preferable that a latch circuit includes: a second inverter connected between the output node of the ring oscillator and the output node of the clock generating circuit; and a clocked inverter, in inverse parallel connection to the second inverter, being deactivated when the activating signal is at the first level, while being activated when the activating signal is at the second level. In this case, the latch circuit can be constructed with ease.

It is further preferable that at least three second inverters are provided and the at least three second inverters are connected in series between the output node of the ring oscillator and the output node of the clock generating circuit. In this case, a gain of a latch circuit can be high; therefore, an output level of the latch circuit can be quickly rendered definite even when the latch circuit enters a metastable state.

It is further preferable that further provided is a noise filter inserted between an output node of the second inverter and the output node of the clock generating circuit and for eliminating noise from an output signal of the second inverter. In this case, generation of a glitch in the clock signal can be prevented from occurring with more of certainty.

It is further preferable that the clock signal is used as a driving clock signal for the charge pump circuit. In this case, it is prevented from occurring that a glitch occurs in the clock signal and an electric charge is excessively supplied from the charge pump circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
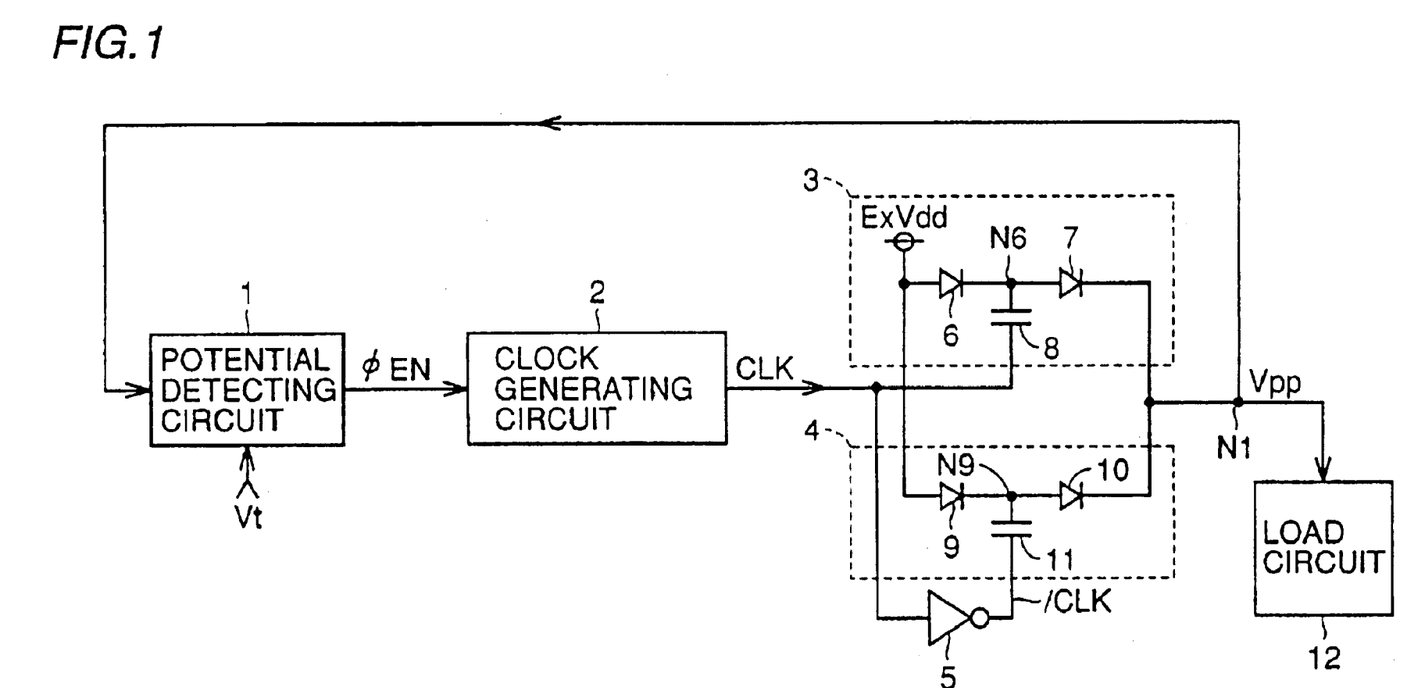
FIG. 1 is a circuit block diagram representing a configuration of a boosted potential generating circuit according to a first embodiment of the present invention.

FIG. 1 is a circuit block diagram representing a configuration of a boosted potential generating circuit according to a first embodiment of the present invention.

In FIG. 1, the boosted potential generating circuit includes: a potential detecting circuit 1; a clock generating circuit 2; charge pump circuits 3 and 4 and an inverter 5, wherein an output node N1 of the boosted potential generating circuit is connected to a load circuit 12.

The potential detecting circuit 1 sets an activating signal φEN to H level when Vpp<Vt in comparison of a potential Vpp on the output node N1 with a target potential Vt, while setting the activating signal φEN to L level when Vpp≧Vt in the comparison.

The clock generating circuit 2 generates a clock signal CLK in response to transition of the activating signal φEN to H level, while ceasing generation of the clock signal CLK in response to transition of the activating signal φEN to L level. Detailed description will be given of the clock generating circuit 2 later. The clock signal CLK is provided not only direct to the charge pump circuit 3, but also to the charge pump circuit 4 after inverted by the inverter 5.

The charge pump circuit 3 includes: diodes 6 and 7; and a capacitor 8. The diodes 6 and 7 are connected in series between an external power source potential ExVdd line and the output node N1. One electrode of the capacitor 8 receives the clock signal CLK and the other electrode thereof is connected to the cathode (node N6) of the diode 6. The capacitor 8 is precharged to ExVdd−Vd in a period in which the clock signal CLK is at L level. The clock signal CLK goes to H level, a node N6 is then boosted to 2ExVdd−Vd and a positive electric charge is supplied to the output node N1 from the node N6 through the diode 7.

The charge pump 4 includes: diodes 9 and 10; and a capacitor 11. The diodes 9 and 10 are connected in series between the external power source ExVdd line and the output node N1. One electrode of the capacitor 111 receives an inverted clock signal /CLK from the inverter 5 and the other electrode thereof is connected to the cathode (node N9) of the diode 9. The capacitor 11 is precharged to ExVdd−Vd in a period in which the inverted clock signal /CLK is at L level. When the inverted clock signal /CLK goes to H level, a node N9 is boosted to 2ExVdd−Vd and a positive electric charge is supplied to the output node N1 from the node N9 through the diode 10.

Hence, not only is the capacitor 8 of the charge pump circuit 3 precharged, but a positive electric charge is also supplied to the output node N1 from the charge pump circuit 4 during a period in which the clock signal CLK is at L level, while not only is a positive electric charge supplied to the output node N1 from the charge pump circuit 3, but the capacitor 11 of the charge pump circuit 4 is also precharged during a period in which the clock signal CLK is at H level.

Next, description will be given of operation of the boosted potential generating circuit. Since, in an initial state, the potential Vpp on the node N11 is sufficiently low, the activating signal φEN is set to H level by the potential detecting circuit 1. Thereby, the clock generating circuit 2 is activated to generate the clock signal CLK. The clock signal CLK is provided not only direct to the charge pump circuit 3, but also to the charge pump circuit 4 after inverted by the inverter 5.

A positive electric charge is supplied to the output node N1 from the charge pump circuit 3 in one side in a period in which the clock signal CLK is at H level, while a positive electric charge is supplied to the output node N1 from the charge pump circuit 4 in the other side in a period in which the clock signal CLK is at L level. Hence, the potential Vpp on the node N1 rises rapidly.

When the boosted potential Vpp reaches the target potential Vt, the activating signal φEN is set to L level by the potential detecting circuit 1. Thereby, in the clock generating circuit 2, generation of the clock signal CLK is ceased and supply of an electric charge to the node N1 from the charge pump circuits 3 and 4 is also ceased.

When a current is consumed in the load circuit 12 to lower the boosted potential Vpp lower than the target potential Vt, the activating signal φEN is set to H level by the potential detecting circuit 1. Thereby, in the clock generating circuit 2, generation of the clock CLK is started and an electric charge is supplied to the node N1 from the charge pump circuits 3 and 4. In this fashion, the boosted potential Vpp is held at the target potential Vt.

Figure 2:
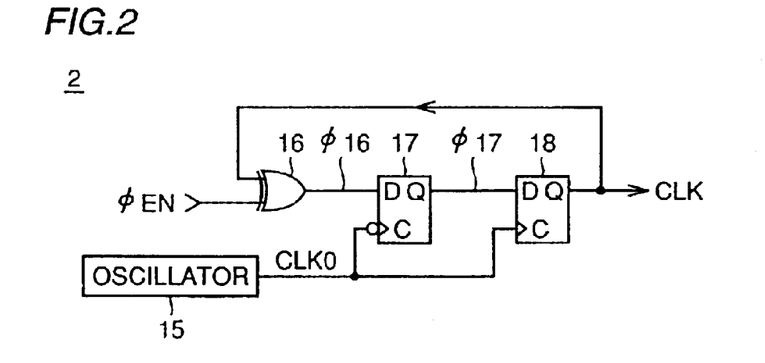
FIG. 2 is a circuit block diagram representing a configuration of a clock generating circuit shown in FIG. 1.
Figure 3A:
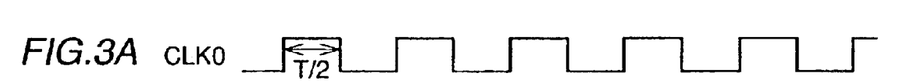
FIGS. 3A to 3E are time charts representing operation of the clock generating circuit shown in FIG. 2.
Figure 3B:
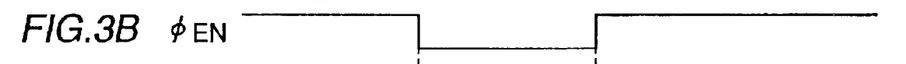
Figure 3C:
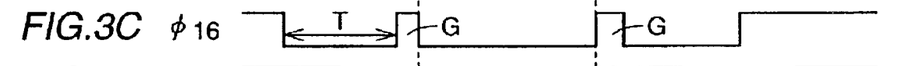
Figure 3D:
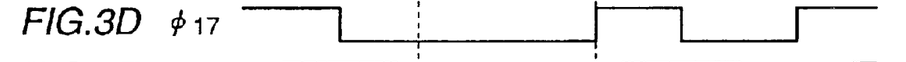
Figure 3E:
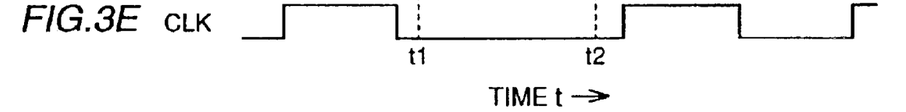

FIG. 2 is a circuit block diagram representing a configuration of the clock generating circuit 2. In FIG. 2, the clock generating circuit 2 includes: an oscillator 15; an EX-OR gate 16; a negative edge trigger D latch circuit 17; and a positive edge trigger D latch circuit 18. The oscillator 15 generates a reference clock signal CLK0 of a prescribed clock cycle T to provide the signal to the clock terminals C of the D latch circuits 17 and 18.

The EX-OR gate 16 receives the activating signal φEN and the output clock CLK of the clock generating circuit 2, and an output signal φ16 thereof is inputted to the input terminal D of the D latch circuit 17. When the activating signal φEN is at H level, the EX-OR gate 16 acts as an inverter for the clock signal CLK and a level of the signal φ16 comes to be a complementary level of a level of the clock signal CLK. When the activating signal φEN is at L level, the EX-OR gate 16 acts as a buffer for the clock signal CLK and a level of the signal φ16 comes to be the same level as the clock signal CLK.

The D latch circuit 17 passes the signal φ16 therethrough without any alteration therein in a period in which the reference clock signal CLK0 is at L level and holds a level of an output signal φ17 in response to transition of the reference clock signal CLK0 from L level to H level. That is, the output signal φ17 of the D latch circuit 17 assumes the same level as the signal φ16 in a period in which the reference clock signal CLK0 is at L level, while being held at a level that the output signal φ17 assumes at the instant of the rise of the reference clock signal CLK0 from L level to H level in a period in which the reference clock signal CLK0 is at H level. The output signal φ17 of the D latch circuit 17 is inputted to the input terminal D of the D latch circuit 18.

The D latch circuit 18 passes the signal φ17 therethrough without any alteration therein in a period in which the reference clock signal CLK0 is at H level and holds a level of the output signal CLK in response to transition of the reference clock signal CLK0 from H level to L level. That is, the dock signal CLK of the D latch circuit 18 assumes the same level as the signal φ17 in a period in which the reference clock signal CLK0 is at H level, while being held at a level that the clock signal CLK0 assumes at the instant of the fall of the reference clock signal CLK0 from H level to L level in a period in which the reference clock signal CLK0 is at H level. The output signal of the D latch circuit 18 becomes the output clock signal CLK of the clock generating circuit 2.

FIGS. 3A to 3E are time charts representing operation of the clock generating circuit 2. Since when the activating signal φEN is at H level, the EX-OR gate 16 acts as an inverter for the clock signal CLK, a level of the signal 416 is inverted in response to the rising edge of the reference clock signal CLK0. A level of the signal φ17 is inverted in response to the falling edge of the reference clock signal CLK0. A level of the clock signal CLK is inverted in response to the rising edge of the reference clock signal CLK0. Hence, the clock signal CLK becomes a signal obtained by frequency dividing the reference clock signal CLK0 by a factor 2.

When the reference clock signal CLK0 is raised from L level to H level, and not only is the signal φ16 raised from L level to H level, but the clock signal CLK is lowered from H level to L level and immediately thereafter (t1), the activating signal φEN is lowered from the H level to L level, then the Ex-OR gate 16 acts as a buffer for the clock signal CLK and the signal φ16 is lowered from H level to L level. For this reason, a glitch G occurs in the signal φ16. The signal φ17 and the clock signal CLK are, however, fixed at L level and no glitch occur in the signal φ17 or the clock signal CLK.

When the activating signal φEN is raised from L level to H level at a time t2 in a period in which the reference clock signal CLK0 is at L level, the EX-OR gate 16 acts as an inverter for the clock signal CLK and the signals φ 16 and φ 17 are raised from L level to H level. Then, not only is the signal φ16 lowered from H level to L level, but the clock signal CLK is also raised from L level to H level in response to the rising edge of the reference clock signal CLK0. Hence, while a glitch occurs in the signal φ16, no glitch G occurs in the clock signal CLK.

In this embodiment, since the reference clock signal CLK0 is frequency divided by the two D latch circuits 17 and 18 to generate the clock signal CLK, generation of a glitch G in the clock signal CLK can be prevented from occurring. Hence, the boosted potential Vpp can be correctly held at the target potential Vt.

Figure 4:
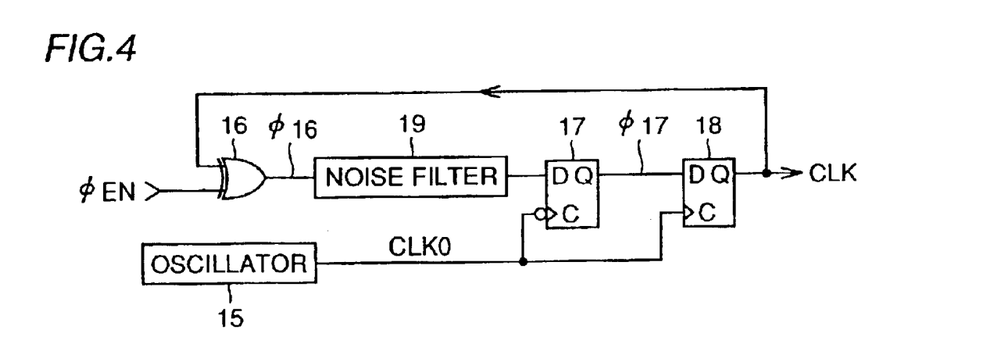
FIG. 4 is a circuit block diagram representing an example modification of the first embodiment.

Description will be given of an example modification of this first embodiment below. In the example modification of FIG. 4, a noise filter 19 is provided between the output of the EX-OR gate 16 and the input terminal D of the D latch circuit 17. In this case, a glitch caused in the output signal φ16 of the EX-OR gate 16 by a deviation in latch timing of the D latch circuits 17 and 18 due to skew or the like, delays in the EX-OR gate 16 and the D latch circuits 17 and 18, or the like can be effectively eliminated by the noise filter 19.

Figure 5:
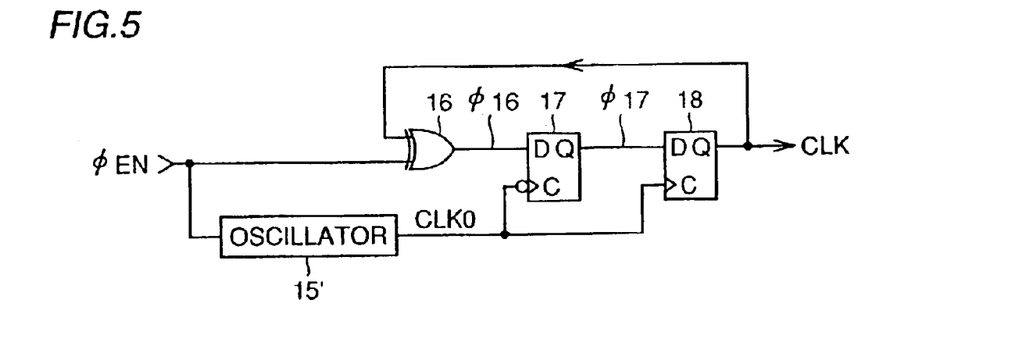
FIG. 5 is a circuit block diagram representing another example modification of the first embodiment.

Furthermore, in an example modification of FIG. 5, the oscillator 15 is replaced with an oscillator 15'. The oscillator 15' is activated to generate the reference clock signal CLK0 when the activating signal φEN is at H level, while being deactivated to cease generation of the reference clock signal CLK0 when the activating signal φEN is at L level. In this case, when the clock signal CLK is unnecessary, the oscillator 15' is deactivated; therefore low power consumption can be realized.

Figure 6:
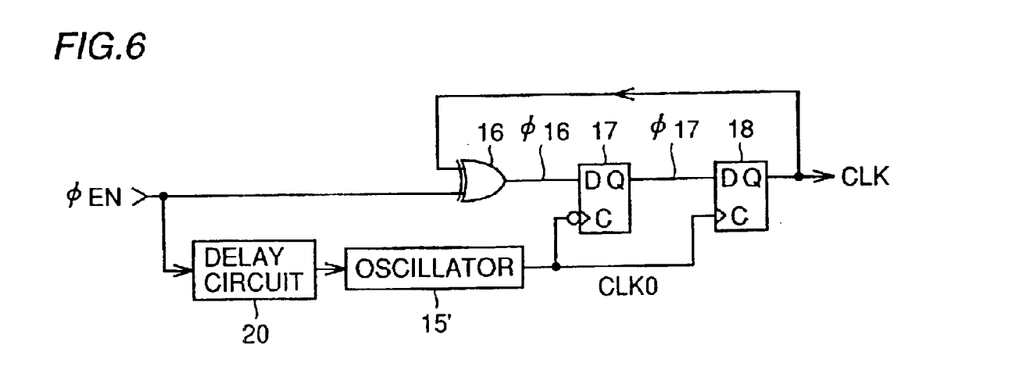
FIG. 6 is a circuit block diagram representing still another example modification of the first embodiment.

Furthermore, in an example modification of FIG. 6, a delay circuit 20 is added to the example modification of FIG. 5. The delay circuit 20 delays the activating signal φEN by a prescribed time and provide the delayed signal φEN to the oscillator 15'. In this case, even in a case where a glitch G occurs in the reference clock signal CLK0 when the oscillator 15' transitions from the active state to the inactive state, then output levels of the D latch circuits 17 and 18 are fixed prior to the arrival of the glitch G at the clock terminals C of the D latch circuits 17 and 18; therefore, generation of the glitch G in the clock signal CLK can be prevented from occurring. Note that when the delay circuit 25 is provided between the output node of the oscillator 15' and the clock terminals C of the D latch circuits 17 and 18 as well, the same effect is ensured.

[Second Embodiment]

Figure 7:
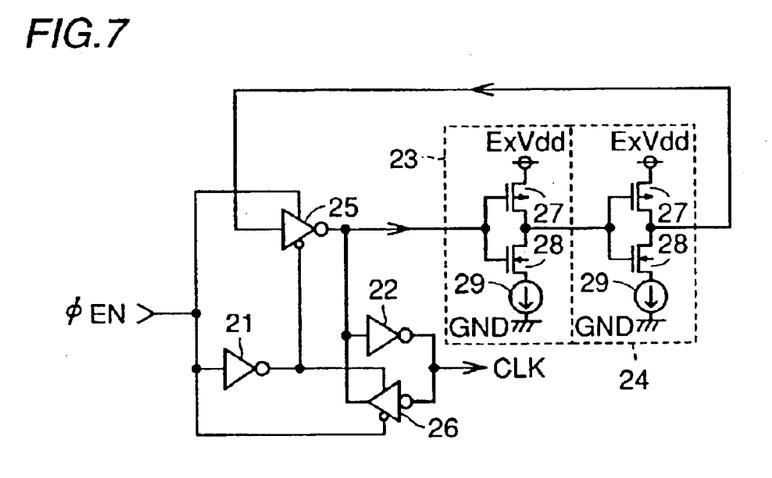
FIG. 7 is circuit diagram representing a clock generating circuit of a boosted potential generating circuit of a second embodiment of the present invention.

FIG. 7 is circuit diagram representing a clock generating circuit of a boosted potential generating circuit of a second embodiment of the present invention.

In FIG. 7, the clock generating circuit includes: inverters 21 to 24; and clocked inverters 25 and 26. The inverters 23 and 24, and the clocked inverter 25 are connected in a ring configuration to constitute a ring oscillator. The inverter 22 and the clocked inverter 26 are connected in a ring configuration to constitute a latch circuit. An output signal of the inverter 22 becomes the output clock signal CLK of the clock generating circuit. The activating signal φEN is inputted not only direct to the control node of the clocked inverter 25 and the inverting control node of the clocked inverter 26, but also to the inverting control node of the clocked inverter 25 and the control node of the clocked inverter 26 through the inverter 21.

While each of the inverters 21 and 22 is an ordinary inverter including a P channel MOS transistor and an N channel MOS transistor connected in series between the external power source potential ExVdd line and the ground potential GND line, each of the inverter 23 and 24 includes: a P channel MOS transistor 27 and an N channel MOS transistor 28, and a constant current source 29 connected in series between the external power source potential ExVdd line and the ground potential GND line. With such a configuration adopted, fluctuations in oscillating frequency of the ring oscillator due to fluctuations in the external power source potential ExVdd or the like can be prevented from occurring.

Next, description will be given of operation of the clock generating circuit. When the activating signal φEN is at H level, the clocked inverter 25 is activated, while the clocked inverter 26 is deactivated. Thereby, the ring oscillator constructed from the inverters 23 and 24, and the clocked inverter 25 is activated to generate the clock signal CLK. The clock signal CLK is provided to a charge pump circuit through the inverter 22.

When the activating signal φEN is lowered from H level to L level, not only is the clocked inverter 25 deactivated, while the clocked inverter 26 is activated. Thereby, the ring oscillator constructed from the inverters 23 and 24, and the clocked inverter 25 is deactivated to cease level transition of the clock signal, whereby the latch circuit constructed from the inverter 22 and the clocked inverter 26 is activated to latch a level of the clock signal CLK.

In this second embodiment, when the activating signal φEN is lowered from H level to L level, a level of the clock signal CLK at that time is latched; therefore, generation of a glitch G in the clock signal CLK can be prevented from occurring. Hence, there is no chance that as in a prior art practice, a level of the dock signal CLK is altered in response to transition of the activating signal φEN from H level to L level and thereby the charge pump circuit is driven to raise the boosted potential VPP excessively high.

Note that while in this second embodiment, a constant current source 29 is provided between the source of the N channel MOS transistor 28 of each of the inverters 23 and 24 and the ground potential GND line, there is no specific limitation to this configuration, but other configurations are allowed: A constant current source 29 is provided between the external power source potential ExVdd line and the source of a P channel MOS transistor 27 and alternatively, two constant current sources 29 are provided between the source of an N channel MOS transistor 28 and the ground potential GND line, and between the external power source potential ExVdd line and the source of a P channel MOS transistor 27, respectively.

Figure 8:
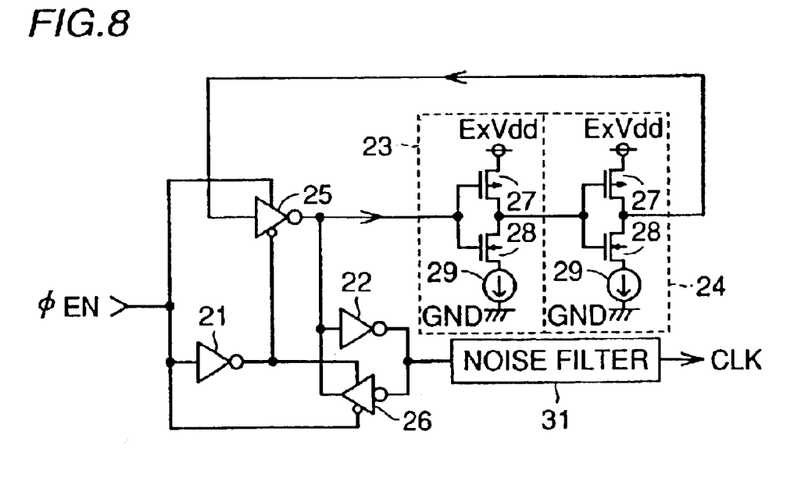
FIG. 8 is a circuit block diagram representing an example modification of the second embodiment.

Description will be given of an example modification of this second embodiment below: In an example modification of FIG. 8, a noise filter 31 is added to the clock generating circuit of FIG. 7. The clock signal CLK generated in a ring oscillator constructed from the inverters 23 and 24 and the clocked inverter 25 is outputted through the inverter 22 and the noise filter 31. When the activating signal φEN is lowered from H level to L level in a state where an output signal of the clocked inverter 25 is at a level in the vicinity of an intermediate level between H and L levels, an output signal of a latch circuit constructed from the inverter 22 and the clocked inverter 26 goes in part way of transition from H level (or L level) to L level (or H level) only to return to the original state and thereby, there arises a case where a glitch G occurs in an output signal of the latch circuit. This glitch G is eliminated by the noise filter 31.

Figure 9:
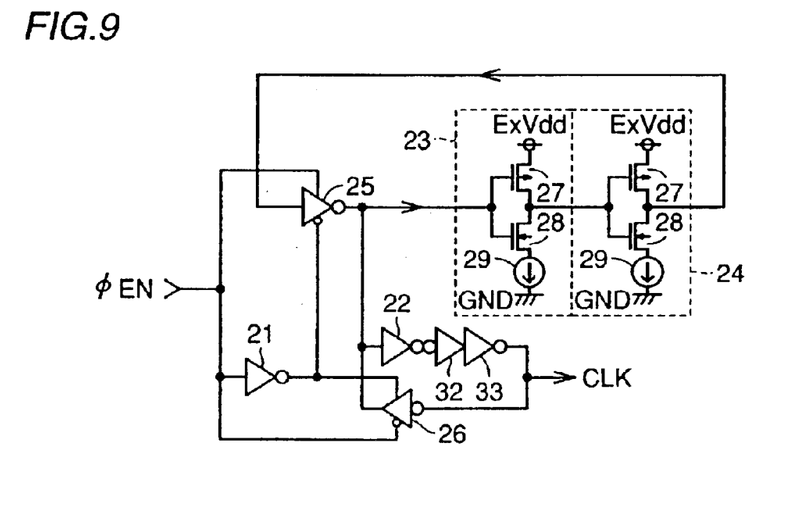
FIG. 9 is a circuit block diagram representing another example modification of the second embodiment.

In an example modification of FIG. 9, inverters 32 and 33 are added to the clock generating circuit of FIG. 7. The inverters 32 and 33 are connected in series between the output node of the inverter 22 and the input node of the clocked inverter 26. An output signal of the inverter 33 becomes the output clock signal CLK. In the clock generating circuit of FIG. 7, an output circuit and a feed back circuit of the latch circuit are constituted of the respective single inverters 22 and 26; therefore, a gain is low and the latch circuit can long remain in a metastable state. In contrast to this, in the example modification of FIG. 9, an output circuit is constructed from three inverters 22, 32 and 33 to increase a gain; therefore, a logic level of the clock signal CLK is made quickly definite even when the latch circuit has entered the metastable state.

Figure 10:
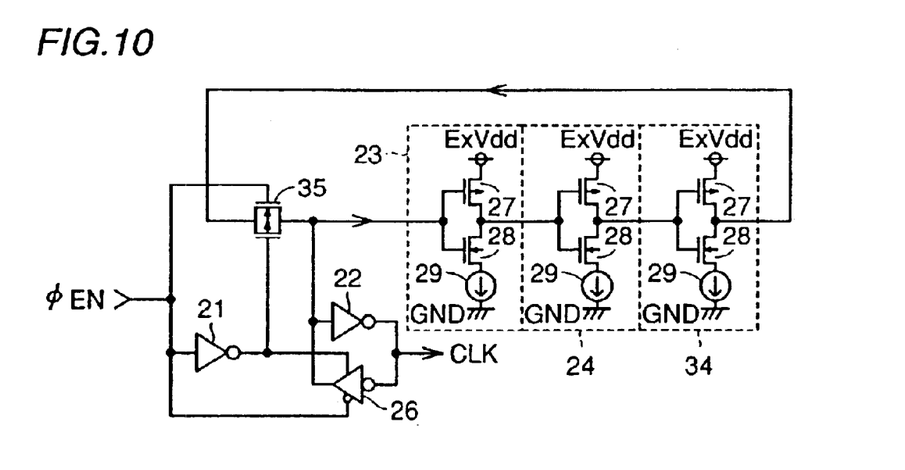
FIG. 10 is a circuit block diagram representing still another example modification of the second embodiment.

Furthermore, in an example modification of FIG. 10, the clocked inverter 25 of the clock generating circuit of FIG. 7 is replaced with an inverter 34 and a transfer gate 35. The inverter 34 and the transfer gate 35 are connected in series between the output node of the inverter 24 and the input node of the inverter 23. The inverter 34 is of the same configuration as the inverters 23 and 24. The activating signal φEN is inputted not only direct to the gate of the N channel MOS transistor side of the transfer gate 35, but also to the gate of a P channel MOS transistor side of the transfer gate 35 through the inverter 21.

When the activating signal φEN is at H level, not only is the transfer gate 35 conductive but the clocked inverter 26 is also deactivated. Thereby, a ring oscillator constructed from the inverters 23, 24 34, and the transfer gate 35 is activated to generate the clock signal CLK. The dock signal CLK is provided to a charge pump circuit through the inverter 22.

When the activating signal φEN is lowed from H level to L level, not only is the transfer gate 35 nonconductive, but the clocked inverter 26 is also activated. Thereby, the ring oscillator constructed from the inverters 23, 24 and 34 and the transfer gate 35 is deactivated to cease an alteration in level of the clock signal CLK and a latch circuit constructed from the inverters 22 and 26 is activated to latch a level of the clock signal CLK. In this example modification as well, the same effect as in FIG. 7 can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock generating circuit generating a clock signal comprising:

a ring oscillator including an odd number of first inverters connected in a ring configuration, being activated to generate a clock signal when an activating signal is at a first level, while being deactivated to cease generation of said clock signal when said activating signal is at a second level; and a latch circuit, connected to an output node of said ring oscillator, and holding a level of the output node of said ring oscillator in response to transition of said activating signal from said first level to said second level, wherein the output node of said ring oscillator is an internal node in the ring configuration and the level of the output node of the ring oscillator is driven to one of a high level and a low level in accordance with the timing of the activating signal driven to the second level from the first level.

2. The clock generating circuit according to claim 1, wherein one first inverter of said odd number of first inverters is a clocked inverter that is activated when said activating signal is at said first level, while being deactivated when said activating signal is at said second level, and whose output node serves as the output node of said ring oscillator.

3. The clock generating circuit according to claim 1, wherein said ring oscillator further includes: a transfer gate inserted between an output node of one first inverter of said odd number of first inverters and an input node of the subsequent first inverter thereof, and being conductive when said activating signal is at said first level, while being nonconductive when said activating signal is at said second level, wherein said input node of said subsequent inverter serves as the output node of said ring oscillator.

4. The clock generating circuit according to claim 1, wherein a first inverter includes: first and second transistors of respective different conductivity types connected in series between first and second power source potential lines; and
at least one constant current source connected in series to said first and second transistors between said first and second power source potential lines.

5. The clock generating circuit according to claim 1, wherein said clock signal is used as a driving clock signal for a charge pump circuit.

6. The clock generating circuit according to claim 1, wherein said latch circuit further comprising: a second inverter connected between the output node of said ring oscillator and an output node of said clock generating circuit; and
a clocked inverter, in inverse parallel connection to said second inverter, being deactivated when said activating signal is at said first level, while being activated when said activating signal is at said second level.

7. The clock generating circuit according to claim 6, further comprising: at least three of said second inverter, which are connected in series between the output node of said ring oscillator and an output node of said clock generating circuit.

8. The clock generating circuit according to claim 6, further comprising: a noise filter inserted between an output node of said second inverter and an output node of said clock generating circuit, and for eliminating noise from an output signal of said second inverter.

* * * * *

UNITED STATES PATENT AND TRADEMARK OFFICE
CERTIFICATE OF CORRECTION

| | |
|---|---|
| PATENT NO. | : 6,781,431 B2 |
| APPLICATION NO. | : 10/349033 |
| DATED | : August 24, 2004 |
| INVENTOR(S) | : Yasuhiko Taito et al. |

It is certified that error appears in the above-identified patent and that said Letters Patent is hereby corrected as shown below:

On the title page item (73) Assignees:, change "Rensas" to -- Renesas --

Signed and Sealed this

Eighth Day of May, 2007

JON W. DUDAS
*Director of the United States Patent and Trademark Office*